(12) United States Patent
Akaishi (10) Patent No.: US 11,444,478 B2
(45) Date of Patent: Sep. 13, 2022

(54) CONTROL DEVICE

(71) Applicant: TOYOTA JIDOSHA KABUSHIKI KAISHA, Toyota (JP)

(72) Inventor: Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 148 days.

(21) Appl. No.: 16/985,319

(22) Filed: Aug. 5, 2020

(65) Prior Publication Data

US 2021/0057930 A1 Feb. 25, 2021

(30) Foreign Application Priority Data

Aug. 21, 2019 (JP) .............................. JP2019-151286

(51) Int. Cl.
*H02J 7/00* (2006.01)
*B60L 58/12* (2019.01)
*G01R 31/3835* (2019.01)

(52) U.S. Cl.
CPC ........ *H02J 7/007182* (2020.01); *B60L 58/12* (2019.02); *G01R 31/3835* (2019.01)

(58) Field of Classification Search
None
See application file for complete search history.

(56) References Cited

U.S. PATENT DOCUMENTS

2013/0241480 A1* 9/2013 Kirimoto ................ B60L 58/22
320/109
2013/0300425 A1 11/2013 Shiraishi et al.

FOREIGN PATENT DOCUMENTS

JP 2017-167163 A 9/2017

* cited by examiner

*Primary Examiner* — Arun C Williams
(74) *Attorney, Agent, or Firm* — Oliff PLC (57) ABSTRACT

A control device includes: a voltage control unit that sequentially switches a command voltage of a direct current-direct current converter between different predetermined measurement voltages to control the command voltage; an obtaining unit that obtains, for each of the measurement voltages, a first terminal voltage of a battery when constant current discharge is performed and a second terminal voltage of the battery when constant current charge is performed; and a correction unit that corrects an SOV-OCV characteristic curve indicating a relationship between the state of charge and an open circuit voltage of the battery, based on a comparison between the first terminal voltages newly obtained by the obtaining unit and the first terminal voltages immediately previously obtained by the obtaining unit and a comparison between the second terminal voltages newly obtained by the obtaining unit and the second terminal voltages immediately previously obtained by the obtaining unit.

7 Claims, 6 Drawing Sheets

CONTROL DEVICE

INCORPORATION BY REFERENCE

The disclosure of Japanese Patent Application No. 2019-151286 filed on Aug. 21, 2019 including the specification, drawings and abstract is incorporated herein by reference in its entirety.

BACKGROUND

1. Technical Field

The disclosure relates to a control device.

2. Description of Related Art

There are cases where an iron phosphate lithium ion battery (LFP battery) is used as a battery mounted on a vehicle. For the iron phosphate lithium ion battery, a state of charge versus open circuit voltage (SOC-OCV) characteristic curve indicating a relationship between a state of charge (SOC) and an open circuit voltage (OCV) of the battery has a flat region in which a rate of change in the open circuit voltage with respect to the state of charge is small. In the flat region, it is difficult to estimate the state of charge of the battery with high accuracy.

As measures to address this issue, Japanese Unexamined Patent Application Publication No. 2017-167163 (JP 2017-167163 A) describes a technique for estimating the state of charge from the SOC-OCV characteristic curve when the measured open circuit voltage of the battery is a value in a change region other than the flat region.

SUMMARY

However, the technique described in JP 2017-167163 A does not consider the change in the SOC-OCV characteristic curve due to aging of the battery. Therefore, as the battery is used longer, a difference between the estimated state of charge estimated from the SOC-OCV characteristic curve and the actual state of charge becomes large, which inhibits the estimation of the state of charge with high accuracy.

The disclosure provides a control device that can estimate a state of charge of an aged battery with high accuracy.

An aspect of the disclosure relates to a control device. The control device includes a voltage control unit, an obtaining unit, and a correction unit. The voltage control unit is configured to sequentially switch a command voltage of a direct current-direct current converter between a plurality of different predetermined measurement voltages to control the command voltage. The direct current-direct current converter is configured to control a state of charge of a battery. The obtaining unit is configured to obtain, for each of the measurement voltages switched by the voltage control unit, a first terminal voltage of the battery when constant current discharge is performed and a second terminal voltage of the battery when constant current charge is performed. The correction unit is configured to correct a state of charge versus open circuit voltage characteristic curve indicating a relationship between the state of charge and an open circuit voltage of the battery, based on a comparison between a plurality of the first terminal voltages newly obtained by the obtaining unit and a plurality of the first terminal voltages immediately previously obtained by the obtaining unit and a comparison between a plurality of the second terminal voltages newly obtained by the obtaining unit and a plurality of the second terminal voltages immediately previously obtained by the obtaining unit.

In the above aspect, the state of charge versus open circuit voltage characteristic curve of the battery may have a flat region in which a rate of change in the open circuit voltage with respect to the state of charge is equal to or less than a predetermined value, and the voltage control unit may be configured to switch the command voltage to a first voltage for controlling the state of charge of the battery to a state of charge at a boundary between the flat region and a region other than the flat region. The first voltage may be one of the measurement voltages of the direct current-direct current converter.

In the above aspect, the voltage control unit may be configured to switch the command voltage between the first voltage, a second voltage higher than the first voltage by a predetermined value, and a third voltage lower than the first voltage by a predetermined value. The first, second, and third voltages may be the measurement voltages of the direct current-direct current converter.

In the above aspect, the correction unit may be configured such that when there is a predetermined difference between at least one of the first terminal voltages newly obtained by the obtaining unit and a corresponding one of the first terminal voltages immediately previously obtained by the obtaining unit, the correction unit corrects the state of charge versus open circuit voltage characteristic curve based on an amount of the difference.

In the above aspect, the correction unit may be configured such that when there is a predetermined difference between at least one of the second terminal voltages newly obtained by the obtaining unit and a corresponding one of the second terminal voltages immediately previously obtained by the obtaining unit, the correction unit corrects the state of charge versus open circuit voltage characteristic curve based on an amount of the difference.

The control device according to the above aspect may further includes a notification unit configured to provide a predetermined notification indicating an abnormality of the battery when there is the difference only one of between the at least one of the first terminal voltages newly obtained by the obtaining unit and the corresponding one of the first terminal voltages immediately previously obtained by the obtaining unit and between the at least one of the second terminal voltages newly obtained by the obtaining unit and the corresponding one of the second terminal voltages immediately previously obtained by the obtaining unit.

In the above aspect, the voltage control unit may be configured to derive an open circuit voltage corresponding to a target state of charge based on a result of correction of the state of charge versus open circuit voltage characteristic curve, update the command voltage of the direct current-direct current converter based on the open circuit voltage, and control charge and discharge of the battery using the command voltage.

With the control device according to the aspect of the disclosure, it is possible to estimate the state of charge of the aged battery with high accuracy.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

A control device for controlling charge/discharge of an in-vehicle battery according to the disclosure appropriately corrects, when newly obtaining a terminal voltage of the in-vehicle battery, an state of charge versus open circuit voltage (SOC-OCV) characteristic curve of the in-vehicle battery based on a difference between a terminal voltage of the in-vehicle battery obtained and stored immediately previously and the newly obtained terminal voltage. This makes it possible to estimate a state of charge (SOC) of an aged battery with high accuracy.

Hereinafter, an embodiment of the disclosure will be described in detail with reference to the drawings.

Configurations

Figure 1:
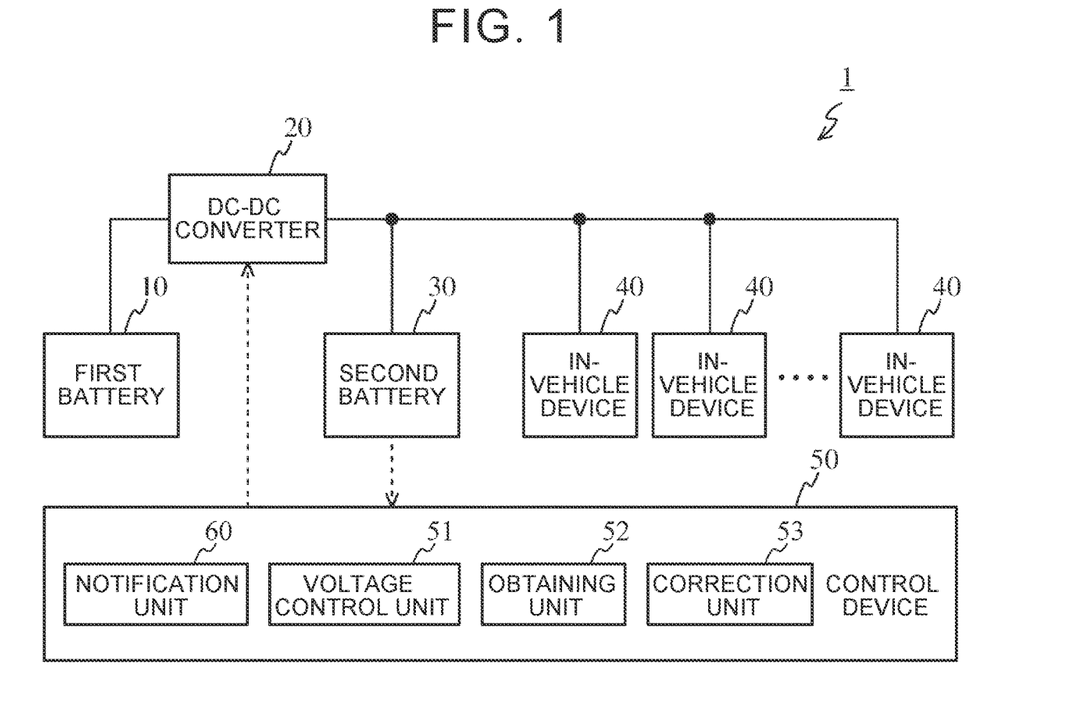
FIG. 1 is a schematic configuration diagram of a power supply system including a control device according to an embodiment of the disclosure.

FIG. 1 is a block diagram showing a schematic configuration of a power supply system including a control device according to the embodiment of the disclosure. A power supply system 1 illustrated in FIG. 1 includes a first battery 10, a direct current-direct current (DC-DC) converter 20, a second battery 30, a plurality of in-vehicle devices 40, and a control device 50 of the present embodiment. The power supply system 1 is mounted on a hybrid vehicle (HV), a plug-in hybrid vehicle (PHV), an electric vehicle (EV), and the like configured to use a motor as a power source.

The first battery 10 is a high-voltage battery for supplying electric power to an electric motor (not shown) and the DC-DC converter 20. The first battery 10 may be configured to be able to obtain electric power from an external power supply via a plug-in charger (not shown) that is connectable to the external power supply. As the first battery 10, a secondary battery such as a lithium ion battery that is configured to be chargeable and dischargeable is used.

The DC-DC converter 20 connects the first battery 10 with the second battery 30 and the in-vehicle devices 40, and supplies electric power of the first battery 10 to the second battery 30 and the in-vehicle devices 40. When supplying electric power, the DC-DC converter 20 can convert a high voltage of the first battery 10, which is an input voltage, into a predetermined low voltage based on a voltage command value provided from the control device 50 and output the low voltage.

Figure 2:
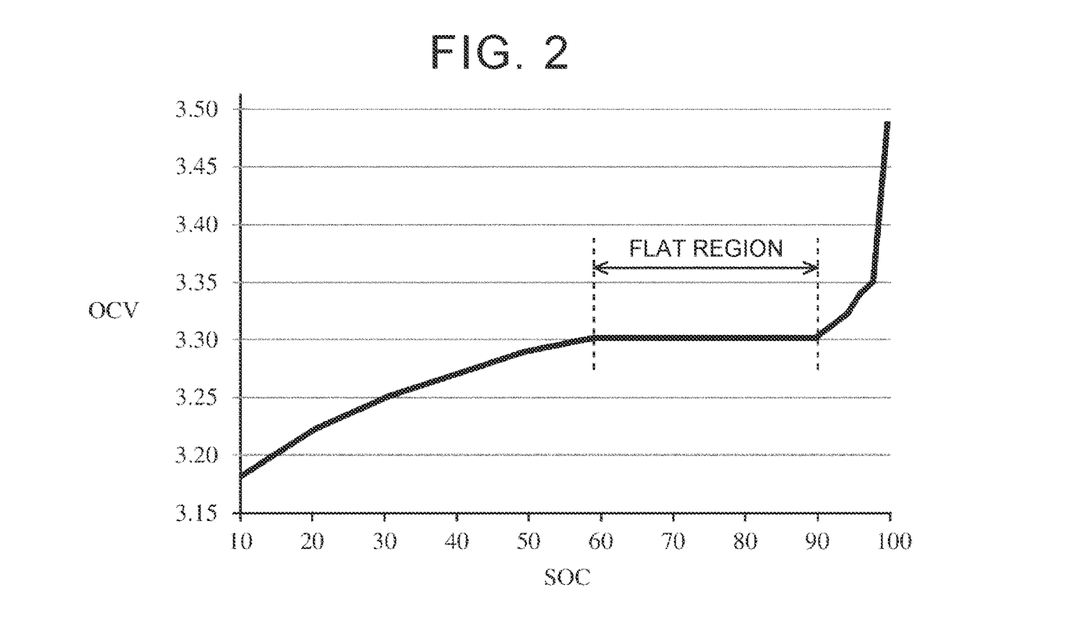
FIG. 2 is a diagram showing an example of an SOC-OCV characteristic curve of a lithium-ion battery.

The second battery 30 is a low-voltage battery that is charged with electric power output from the DC-DC converter 20 and discharges its own electric power. For example, an iron phosphate lithium ion battery (LFP battery) having an SOC-OCV characteristic curve with a flat region in which a rate of change in an open circuit voltage (OCV) with respect to a state of charge (SOC) is equal to or less than a predetermined value, as shown in FIG. 2, can be used as the second battery 30.

The in-vehicle devices 40 are various devices mounted on the vehicle that operate with electric power output from the DC-DC converter 20 and electric power of the second battery 30. The in-vehicle devices 40 include, for example, actuators such as motors and solenoids, lights such as headlamps and room lights, air conditioners such as heaters and coolers, steering devices, brakes, and electronic control units (ECUs) for autonomous driving and advanced driving assistance.

The control device 50 controls charge/discharge of the second battery 30 through the DC-DC converter 20 to obtain predetermined information on the state of the second battery 30, and corrects the SOC-OCV characteristic curve of the second battery 30 based on the obtained predetermined information. The control device 50 can be typically configured as an ECU including a processor, a memory, an input/output interface, and the like. The control device 50 may include some of or all of the ECUs mounted on the vehicle, such as an ECU that can control the DC-DC converter 20 and an ECU that can monitor the state of second battery 30. In the control device 50 of the present embodiment, the processor reads a program stored in the memory and executes the program so as to perform functions of a voltage control unit 51, an obtaining unit 52, a correction unit 53, and a notification unit 60 described below.

The voltage control unit 51 sequentially switches a command voltage of the DC-DC converter 20 between different predetermined measurement voltages during a predetermined period in which whether to correct the SOC-OCV characteristic curve of the second battery 30 is determined. The predetermined period is preferably a period in which the power supply of the vehicle is ON (READY-ON), the state of charge of the second battery 30 is high, and the state of the second battery 30 is stable.

The obtaining unit 52 obtains a terminal voltage of the second battery 30 in a predetermined state, for each of the measurement voltages switched by the voltage control unit 51. The obtaining unit 52 obtains the state of charge of the second battery 30 at the time of obtaining the terminal voltage.

The correction unit 53 corrects the SOC-OCV characteristic curve indicating a relationship between the state of charge (SOC) and the open circuit voltage (OCV) of the second battery 30 based on a comparison between a plurality of terminal voltages newly obtained by the obtaining unit 52 and a plurality of terminal voltages immediately previously obtained and stored by the obtaining unit 52.

Control

Next, control performed by the control device 50 according to the present embodiment will be described with reference to FIGS. 3A, 3B, 4, 5, and 6.

Figure 3A:
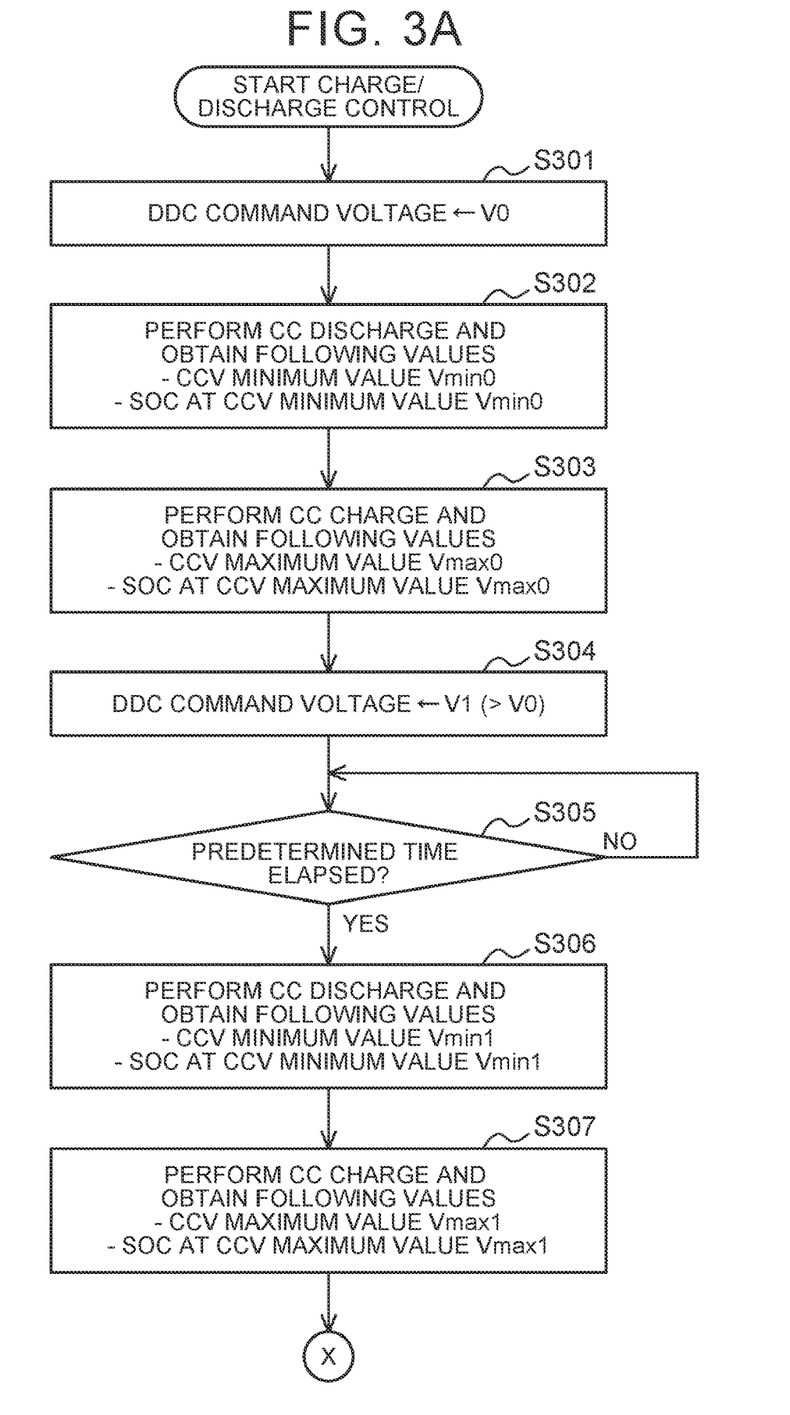
FIG. 3A is a flowchart showing a process procedure of charge/discharge control performed by the control device.
Figure 3B:
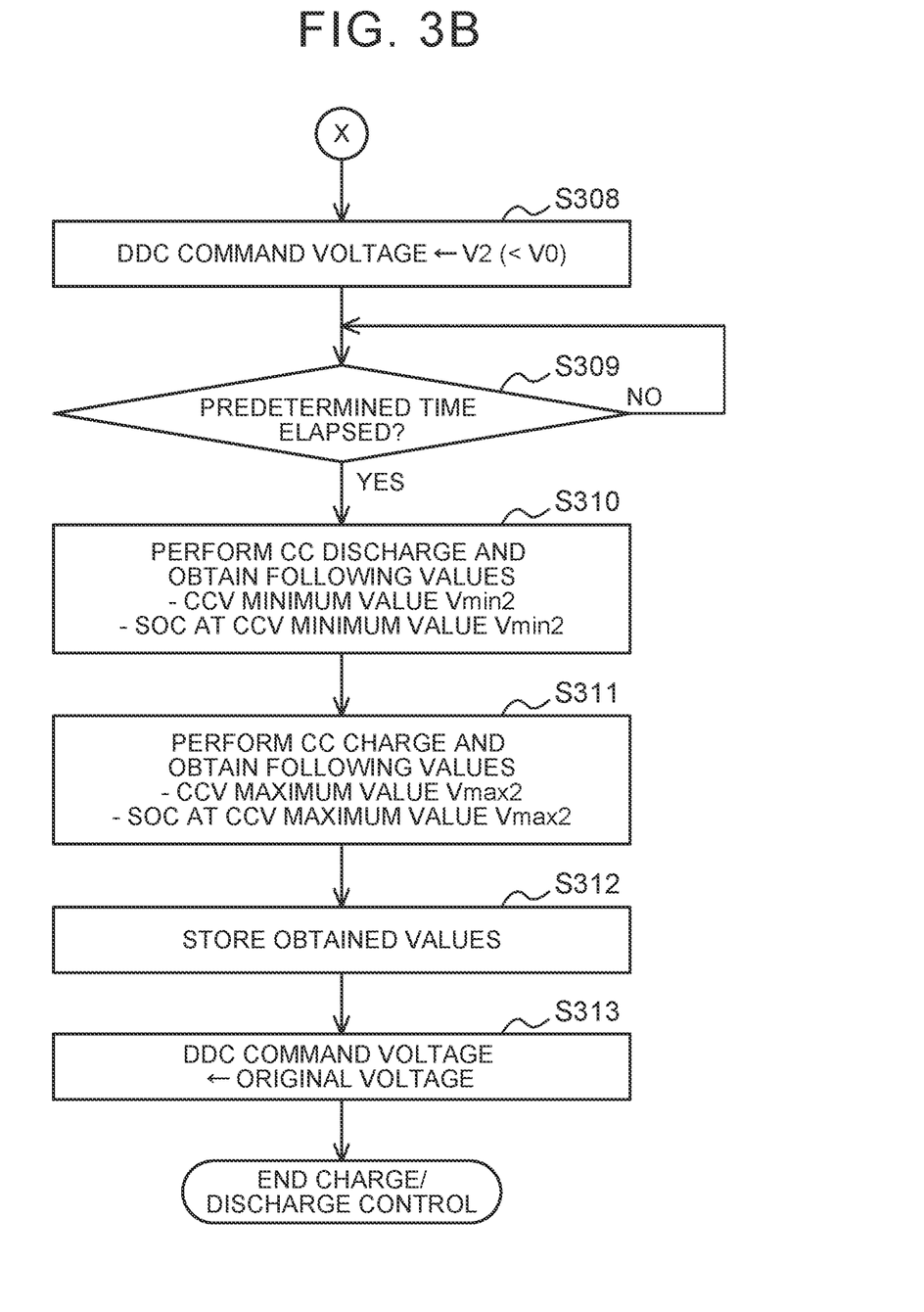
FIG. 3B is a flowchart showing the process procedure of the charge/discharge control performed by the control device.
Figure 4:
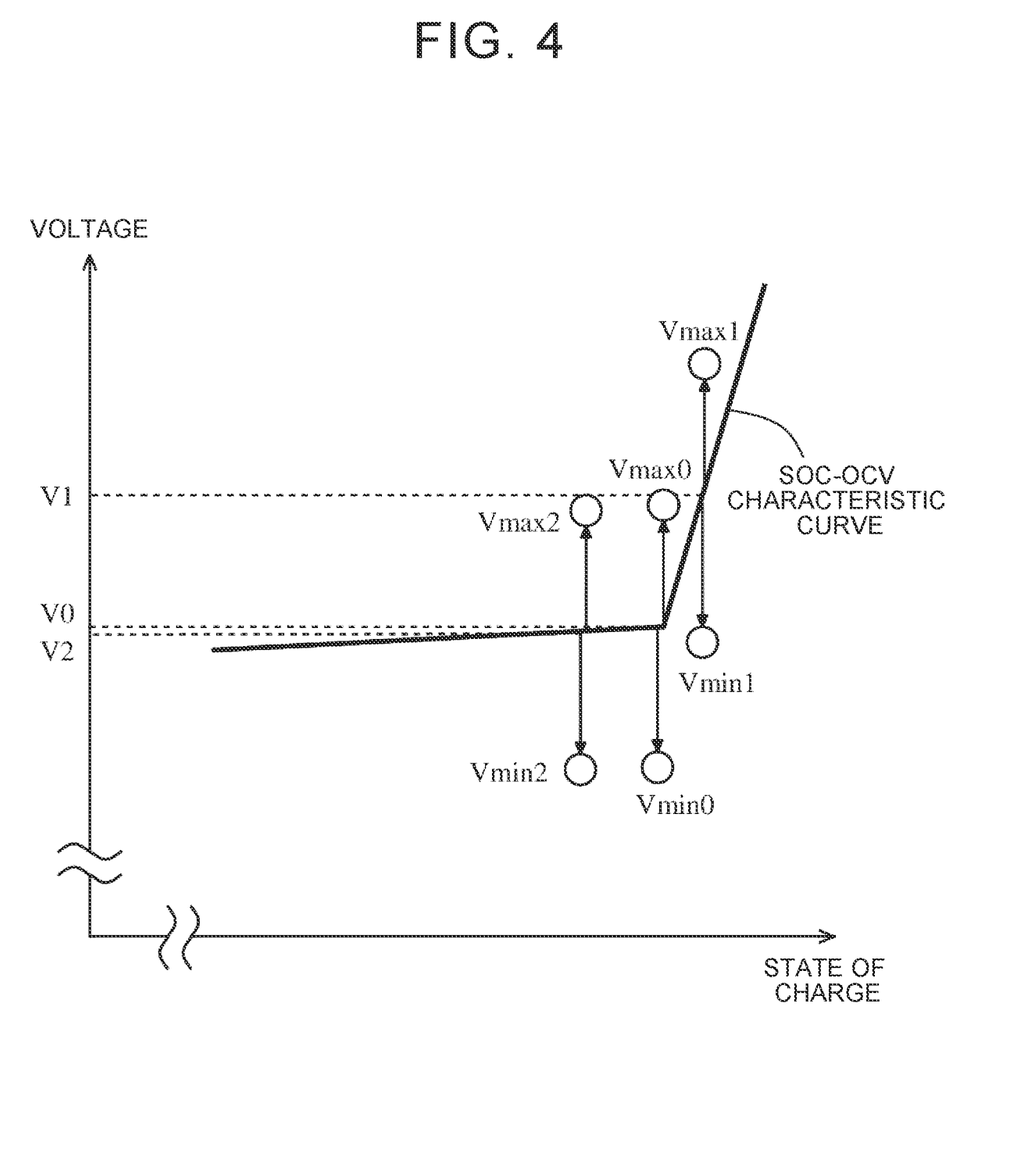
FIG. 4 is a diagram showing examples of values obtained through the charge/discharge control.

FIG. 3A and FIG. 3B are flowcharts showing a process procedure of charge/discharge control for the second battery 30 using the DC-DC converter 20, which is performed by the control device 50. Processing in FIG. 3A and processing in FIG. 3B are connected by a connector X. FIG. 4 is a diagram showing examples of values obtained through the charge/discharge control of FIGS. 3A and 3B.

The charge/discharge control shown in FIGS. 3A and 3B is performed at least once during a period in which the power supply system of the vehicle is ON (READY-ON).

Step S301

The control device 50 sets the command voltage of the DC-DC converter 20 to a predetermined measurement voltage V0. The measurement voltage V0 may be any voltage (OCV) based on the current SOC-OCV characteristic curve, and may be a voltage for controlling the state of charge of the second battery 30 to be a predetermined target state of charge (target SOC). That is, the measurement voltage V0 may be a voltage for controlling the state of charge of the second battery 30 to be a state of charge at a boundary between the flat region and a change region other than the flat region of the second battery 30.

The charge/discharge control according to the present embodiment is preferably started when the state of charge of the second battery 30 is high and the state of the second battery is stable. However, if the charge/discharge control is started with the state of charge of the second battery 30 deviating from the target state of charge, processing in step S302 and the subsequent steps may be performed after a predetermined time has elapsed. The predetermined time may be, for example, a time required for the second battery 30 to be charged to have the target state of charge or a time required for the second battery 30 to discharge electric power to have the target state of charge.

Step S302

The control device 50 performs constant current discharge (CC discharge) with a predetermined current value using the DC-DC converter 20, and obtains the terminal voltage of the second battery 30 at the measurement voltage V0, that is, a closed circuit voltage (CCV) minimum value Vmin0 that is a minimum closed circuit voltage. The control device 50 also obtains the state of charge (SOC) of the second battery 30 at the time of the CCV minimum value Vmin0. The state of charge can be easily obtained using a well-known OCV method, a current integration method, or the like.

Step S303

The control device 50 performs constant current charge (CC charge) with a predetermined current value, and obtains the terminal voltage of the second battery 30 at the measurement voltage V0, that is, a CCV maximum value Vmax0 that is a maximum closed circuit voltage. The control device 50 also obtains the state of charge of the second battery 30 at the time of the CCV maximum value Vmax0. The state of charge can be easily obtained using a well-known OCV method, a current integration method, or the like.

Step S304

The control device 50 sets the command voltage of the DC-DC converter 20 to a predetermined measurement voltage V1. The measurement voltage V1 is set to be higher than the measurement voltage V0 (V1>V0).

Step S305

The control device 50 determines whether a predetermined time has elapsed after setting the command voltage of the DC-DC converter 20 to the measurement voltage V1. The predetermined time can be set to a time in which charge of the second battery 30 is estimated to be completed with the measurement voltage V1. When it is determined that the predetermined time has elapsed (step S305, Yes), the process proceeds to step S306.

Step S306

The control device 50 performs constant current discharge with a predetermined current value using the DC-DC converter 20 with a predetermined current value, and obtains the terminal voltage of the second battery 30 at the measurement voltage V1, that is, a CCV minimum value Vmin1 that is a minimum closed circuit voltage. The control device 50 also obtains the state of charge of the second battery 30 at the time of the CCV minimum value Vmin1. The state of charge can be easily obtained using a well-known OCV method, a current integration method, or the like.

Step S307

The control device 50 performs constant current charge with a predetermined current value, and obtains the terminal voltage of the second battery 30 at the measurement voltage V1, that is, a CCV maximum value Vmax1 that is a maximum closed circuit voltage. The control device 50 also obtains the state of charge of the second battery 30 at the time of the CCV maximum value Vmax1. The state of charge can be easily obtained using a well-known OCV method, a current integration method, or the like.

Step S308

The control device 50 sets the command voltage of the DC-DC converter 20 to a predetermined measurement voltage V2. The measurement voltage V2 is set to be lower than the measurement voltage V0 (V2<V0).

Step S309

The control device 50 determines whether a predetermined time has elapsed after setting the command voltage of the DC-DC converter 20 to the measurement voltage V2. The predetermined time can be set to a time in which discharge of the second battery 30 is estimated to be completed following the measurement voltage V2. When it is determined that the predetermined time has elapsed (step S309, Yes), the process proceeds to step S310.

Step S310

The control device 50 performs constant current discharge with a predetermined current value using the DC-DC converter 20, and obtains the terminal voltage of the second battery 30 at the measurement voltage V2, that is, a CCV minimum value Vmin2 that is a minimum closed circuit voltage. The control device 50 also obtains the state of charge of the second battery 30 at the time of the CCV minimum value Vmin2. The state of charge can be easily obtained using a well-known OCV method, a current integration method, or the like.

Step S311

The control device 50 performs constant current charge with a predetermined current value, and obtains the terminal voltage of the second battery 30 at the measurement voltage V2, that is, a CCV maximum value Vmax2 that is a maximum closed circuit voltage. The control device 50 also obtains the state of charge of the second battery 30 at the time of the CCV maximum value Vmax2. The state of charge can be easily obtained using a well-known OCV method, a current integration method, or the like.

Through the above processing, the CCV minimum values Vmin0, Vmin1, Vmin2, and the CCV maximum values Vmax0, Vmax1, Vmax2 based on the measurement voltages and the corresponding states of charge with respect to the current SOC-OCV characteristic curve are obtained, as illustrated in FIG. 4.

Step S312

The control device 50 stores the obtained values (the CCV minimum values Vmin0, Vmin1, Vmin2, and the CCV maximum values Vmax0, Vmax1, Vmax2) in a memory (not shown) or the like.

Step S313

The control device 50 resets the command voltage of the DC-DC converter 20 to the original voltage set prior to the measurement voltage V0, and ends the charge/discharge control.

In the above embodiment, an example has been described in which the three voltages V0, V1, V2 are used as the measurement voltages, where the voltage V0 is for controlling the state of charge of the second battery 30 to the state of charge at the boundary between the flat region and a region other than the flat region in the SOC-OCV characteristic curve of the second battery 30, the voltage V1 is higher than the voltage V0 by a predetermined value, and the voltage V2 is lower than the voltage V0 by a predetermined value. However, a voltage other than the three may be used as the measurement voltage.

Also, the order of the discharge process in step S302 and the charge process in step S303, the order of the discharge process in step S306 and the charge process in step S307, and the order of the discharge process in step S310 and the charge process in step S311 may be respectively changed. Further, the order of processing with the measurement voltage V1 in steps S304 to S307 and the processing with the measurement voltage V2 in steps S308 to S311 may be interchanged.

Figure 5:
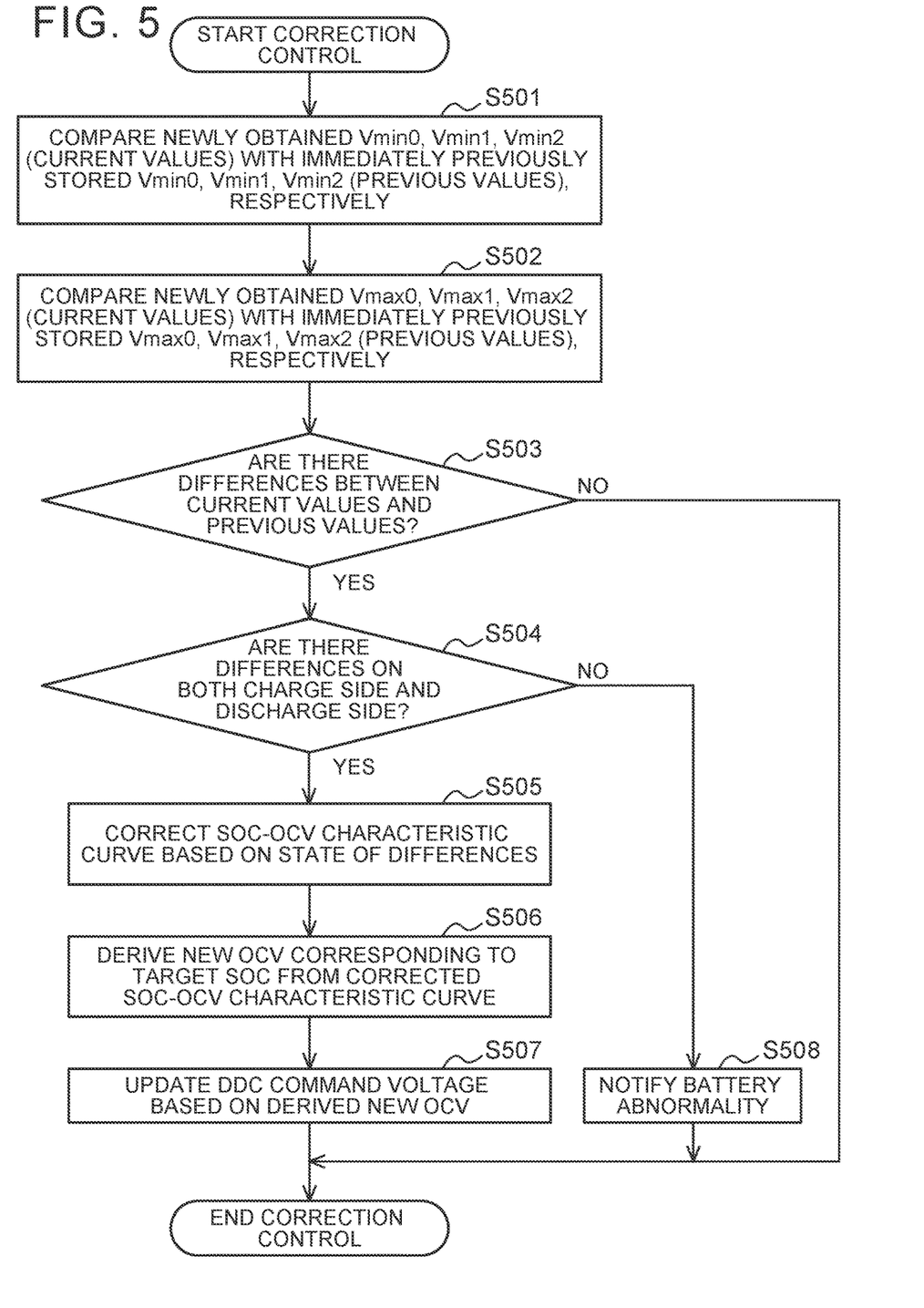
FIG. 5 is a flowchart showing a process procedure of correction control of the SOC-OCV characteristic curve, which is performed by the control device.
Figure 6:
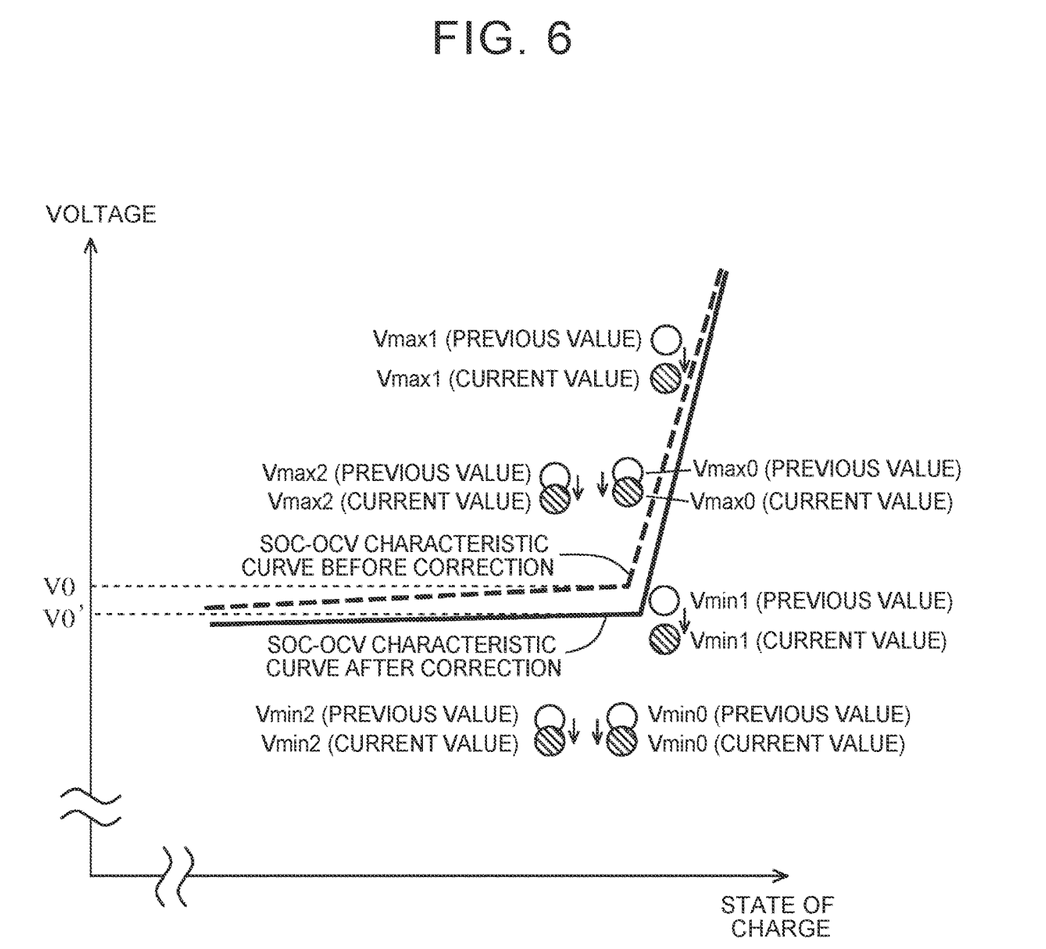
FIG. 6 is a diagram showing a specific example in which the SOC-OCV characteristic curve is corrected through the correction control.

FIG. 5 is a flowchart showing a process procedure of correction control of the SOC-OCV characteristic curve, which is performed by the control device 50. FIG. 6 is a diagram showing a specific example in which the SOC-OCV characteristic curve is corrected through the correction control in FIG. 5.

The correction control shown in FIG. 5 is started, for example, by obtaining new values (the CCV minimum values Vmin0, Vmin1, Vmin2, and the CCV maximum values Vmax0, Vmax1, Vmax2) by the above-described charge/discharge control.

Step S501

In the constant current discharge, the control device 50 compares the newly obtained current CCV minimum values Vmin0, Vmin1, and Vmin2 with previous CCV minimum values Vmin0, Vmin1, and Vmin2, respectively, that have been immediately previously obtained and stored in a memory or the like. Specifically, the control device 50 compares the current CCV minimum value Vmin0 with the previous CCV minimum value Vmin0, compares the current CCV minimum value Vmin1 with the previous CCV minimum value Vmin1, and compares the current CCV minimum value Vmin2 with the previous CCV minimum value Vmin2.

Step S502

In the constant current charge, the control device 50 compares the newly obtained current CCV maximum values Vmax0, Vmax1, and Vmax2 with previous CCV maximum values Vmax0, Vmax1, and Vmax2, respectively, that have been immediately previously obtained and stored in a memory or the like. Specifically, the control device 50 compares the current CCV maximum value Vmax0 with the previous CCV maximum value Vmax0, compares the current CCV maximum value Vmax1 with the previous CCV maximum value Vmax1, and compares the current CCV maximum value Vmax2 with the previous CCV maximum value Vmax2.

Step S503

The control device 50 determines whether there is a predetermined difference between each of the current values and a corresponding one of the previous values on both the discharge side and the charge side (represented by a lower side and an upper side of the SOC-OCV characteristic curve before correction in FIG. 6). The presence or absence of the difference may be determined based on, for example, an amount of difference between the values (voltage difference) or a rate of difference between the values (voltage change rate). Further, the presence or absence of the difference on the discharge side and the presence or absence of the difference on the charge side may be determined based on the same standard or different standards. In addition, on the discharge side, the presence or absence of the difference in the CCV minimum values Vmin0, the presence or absence of the difference in the CCV minimum values Vmin1, and the presence or absence of the difference in the CCV minimum values Vmin2 may be determined based on the same standard or different standards. On the charge side, the presence or absence of the difference in the CCV maximum values Vmax0, the presence or absence of the difference in the CCV maximum values Vmax1, and the presence or absence of the difference in the CCV maximum values Vmax2 may be determined based on the same standard or different standards. When there are the predetermined differences between the current values and the previous values (step S503, Yes), the process proceeds to step S504; otherwise (step S503, No), the control device 50 determines that the SOC-OCV characteristic curve need not be corrected and ends the processing of the correction control.

Step S504

The control device 50 determines whether the predetermined difference between the current value and the previous value is present on both the discharge side or the charge side. When the predetermined difference is determined to be present on both the discharge side and the charge side (step S504, Yes), the process proceeds to step S505; otherwise (step S504, No), that is, when the predetermined difference is present on only one of the discharge side and the charge side, the process proceeds to step S508.

Step S505

The control device 50 corrects the SOC-OCV characteristic curve based on the state of the differences determined in step S503. Although there is no particular limitation on the method of correction, an average value, a maximum value, a minimum value, an intermediate value, or the like of the amounts of differences (voltage differences) can be used as the correction amount, for example. FIG. 6 shows an example in which the SOC-OCV characteristic curve is corrected based on the state of the differences of the values. In the example in FIG. 6, the predetermined difference is found in all the CCV minimum values Vmin0, Vmin1, Vmin2, and the CCV maximum values Vmax0, Vmax1, Vmax2. Thus, the SOC-OCV characteristic curve (dotted line) currently used for estimating the SOC is corrected using the correction amount determined based on the state of the differences, and the corrected curve is used as an updated SOC-OCV characteristic curve (solid line) for estimation of the SOC thereafter. Step S506

The control device 50 derives a new OCV corresponding to the target SOC from the corrected SOC-OCV characteristic curve. For example, when the state of charge of the second battery 30 at the boundary between the flat region and the change region other than the flat region is set as the target SOC, a voltage V0' is derived as the new OCV in FIG. 6. The derivation of the new OCV may be performed by the voltage control unit 51.

Step S507

The control device 50 updates the command voltage of the DC-DC converter 20 based on the derived new OCV. In the example in FIG. 6, the command voltage of the DC-DC converter 20 is updated from the voltage V0 to the voltage V0'. When the update of the command voltage of the DC-DC converter 20 is completed, the processing of the correction control ends. The update of the command voltage may be performed by the voltage control unit 51. The voltage control unit 51 may be configured to control charge/discharge of the battery with the command voltage.

Step S508

When the predetermined difference is found on only one of the discharge side and the charge side, the control device 50 determines that there is an abnormality in the second battery 30 and notifies an occupant of the vehicle or an external management center of the abnormality of the second battery 30. This notification can be provided through existing technologies using image display, audio output, lighting, vibration, etc., via the predetermined notification unit 60 (as shown in FIG. 1) provided in the vehicle. When the abnormality of the second battery 30 is notified, the processing of the correction control ends.

In the above-described embodiment, an example has been described in which the newly obtained current value is compared with the previous value immediately previously obtained and stored to determine the difference. However, the current value may be compared with a plurality of past values to comprehensively determine the difference.

Operations and Effects

As described above, when newly obtaining the terminal voltages (CCV minimum value, CCV maximum value) of the second battery 30, the control device 50 according to the embodiment of the disclosure appropriately corrects the SOC-OCV characteristic curve of the second battery 30 based on the differences between the immediately previously obtained and stored terminal voltages of the second battery 30 and the newly obtained terminal voltages of the second battery 30. This makes it possible to estimate the state of charge (SOC) of an aged battery with high accuracy.

In the control device 50 according to the embodiment of the disclosure, the three voltages V0, V1, V2 are used as the measurement voltages, where the voltage V0 is for controlling the state of charge of the second battery 30 to the state of charge at the boundary between the flat region and a region other than the flat region in the SOC-OCV characteristic curve of the second battery 30, the voltage V1 is higher than the voltage V0 by a predetermined value, and the voltage V2 is lower than the voltage V0 by a predetermined value. By sampling a large number of terminal voltages of the second battery 30 at the measurement voltages such as the voltages V0, V1, and V2, the accuracy of determining the difference is improved, which makes it possible to appropriately correct the SOC-OCV characteristic curve. As a result, the control device 50 can perform optimal charge/discharge control such that the state of charge of the second battery 30 follows the target SOC, based on the corrected SOC-OCV characteristic curve.

Although the embodiment of the disclosure has been described, the disclosure can be construed as a charge/discharge control method and a correction control method performed by the control device, a control program thereof, a computer-readable non-transitory recording medium storing the control program, or a vehicle on which the control device is mounted.

The control device of the disclosure can be used for hybrid vehicles, plug-in hybrid vehicles, electric vehicle, and the like.

What is claimed is:

1. A control device comprising a processor configured to:
    sequentially switch a command voltage of a direct current-direct current converter between a plurality of different predetermined measurement voltages to control the command voltage, the direct current-direct current converter being configured to control a state of charge of a battery;
    obtain, for each of the measurement voltages that are switched, a first terminal voltage of the battery when constant current discharge is performed and a second terminal voltage of the battery when constant current charge is performed; and
    correct a state of charge versus open circuit voltage characteristic curve indicating a relationship between the state of charge and an open circuit voltage of the battery, based on a comparison between a plurality of the first terminal voltages that are newly obtained and a plurality of the first terminal voltages that have been immediately previously obtained and a comparison between a plurality of the second terminal voltages that are newly obtained and a plurality of the second terminal voltages that have been immediately previously obtained.

2. The control device according to claim 1, wherein the state of charge versus open circuit voltage characteristic curve of the battery has a flat region in which a rate of change in the open circuit voltage with respect to the state of charge is equal to or less than a predetermined value, and the processor is configured to switch the command voltage to a first voltage for controlling the state of charge of the battery to a state of charge at a boundary between the flat region and a region other than the flat region, the first voltage being one of the measurement voltages of the direct current-direct current converter.

3. The control device according to claim 2, wherein the processor is configured to switch the command voltage between the first voltage, a second voltage higher than the first voltage by a predetermined value, and a third voltage lower than the first voltage by a predetermined value, the first, second, and third voltages being the measurement voltages of the direct current-direct current converter.

4. The control device according to claim 1, wherein the processor is configured such that when there is a predetermined difference between at least one of the first terminal voltages that are newly obtained and a corresponding one of the first terminal voltages that have been immediately previously obtained, the processor corrects the state of charge versus open circuit voltage characteristic curve based on an amount of the difference.

5. The control device according to claim 1, wherein the processor is configured such that when there is a predetermined difference between at least one of the second terminal voltages that are newly obtained and a corresponding one of the second terminal voltages that have been immediately previously obtained, the processor corrects the state of charge versus open circuit voltage characteristic curve based on an amount of the difference.

6. The control device according to claim 4, further comprising a notification device configured to provide a predetermined notification indicating an abnormality of the battery when there is the difference only one of between the at least one of the first terminal voltages that are newly obtained and the corresponding one of the first terminal voltages that have been immediately previously obtained and between the at least one of the second terminal voltages that are newly obtained and the corresponding one of the second terminal voltages that have been immediately previously obtained.

7. The control device according to claim 1, wherein the processor is configured to:
    derive an open circuit voltage corresponding to a target state of charge based on a result of correction of the state of charge versus open circuit voltage characteristic curve;

update the command voltage of the direct current-direct current converter based on the open circuit voltage; and control charge and discharge of the battery using the command voltage.

\* \* \* \* \*